(12) United States Patent
Kitajima et al.

(10) Patent No.: US 11,815,536 B2
(45) Date of Patent: Nov. 14, 2023

(54) COMPUTER-READABLE RECORDING MEDIUM STORING TRANSFORMER COUPLING PHASE DETERMINATION PROGRAM, TRANSFORMER COUPLING PHASE DETERMINATION APPARATUS, AND TRANSFORMER COUPLING PHASE DETERMINATION METHOD

(71) Applicant: FUJITSU LIMITED, Kawasaki (JP)

(72) Inventors: Hironobu Kitajima, Kawasaki (JP); Tetsuya Kashiwagi, Ota (JP); Sari Kawashima, Fukuoka (JP); Yuriko Korenaga, Fukuoka (JP); Mioto Yoshida, Shinagawa (JP)

(73) Assignee: FUJITSU LIMITED, Kawasaki (JP)

(*) Notice: Subject to any disclaimer, the term of this patent is extended or adjusted under 35 U.S.C. 154(b) by 52 days.

(21) Appl. No.: 17/457,857

(22) Filed: Dec. 6, 2021

(65) Prior Publication Data
US 2022/0260617 A1    Aug. 18, 2022

(30) Foreign Application Priority Data

Feb. 16, 2021   (JP) .................................. 2021-022770

(51) Int. Cl.
G01R 21/133    (2006.01)
H02J 3/00      (2006.01)

(52) U.S. Cl.
CPC .............. *G01R 21/133* (2013.01); *H02J 3/00* (2013.01); *H02J 2203/20* (2020.01)

(58) Field of Classification Search
CPC .......... H02J 13/00001; H02J 3/00; H02J 3/26; H02J 2203/20; G01R 21/133

USPC .......................................................... 702/61
See application file for complete search history.

(56) References Cited

U.S. PATENT DOCUMENTS

| 2015/0100256 A1* | 4/2015 | Kashiwagi | H02J 13/00001 702/59 |
| 2015/0241490 A1* | 8/2015 | Kitajima | G01R 29/18 324/76.77 |
| 2022/0043042 A1* | 2/2022 | Kitajima | G01R 29/18 |

FOREIGN PATENT DOCUMENTS

| JP | 2015-161541 | 9/2015 |
| JP | 2015-161607 | 9/2015 |
| JP | 2017-083397 | 5/2017 |

(Continued)

*Primary Examiner* — John H Le
(74) *Attorney, Agent, or Firm* — Fujitsu IP Center; Tiep H. Nguyen

(57) ABSTRACT

A recording medium stores a program for causing a computer to execute a process including: specifying, based on simulation data, related to an operation of a power distribution facility including power distribution lines and one or more transformers coupled to a phase corresponding to two of the power distribution lines, a correlation relationship between a phase current flowing through the transformer and a line current flowing through power distribution line; generating a scatter diagram indicating a degree of correlation between the phase current and each line current; calculating a probability density at each position in the scatter diagram; and determining, based on a position in a case where actual data of the phase current and the line current in the operation of the power distribution facility is plotted in the scatter diagram and a calculation result of the probability density, a coupling phase of the transformer in the actual data.

19 Claims, 15 Drawing Sheets

(56) References Cited

FOREIGN PATENT DOCUMENTS

| JP | 2017-216874 | 12/2017 |
| JP | 2020-141490 | 9/2020 |

\* cited by examiner

FIG. 4

| CONSUMER ID | TRANSFORMER ID | POWER DISTRIBUTION SECTION ID | DATA AVAILABILITY FLAG |
|---|---|---|---|
| d1 | T1 | I1-2 | YES |
| d2 | T2 | I1-2 | YES |
| d3 | T2 | I1-2 | YES |
| d4 | T2 | I1-2 | NO |
| d5 | T3 | I2-3 | YES |
| d6 | T3 | I2-3 | NO |
| ... | | | |

FIG. 5

| STANDARD POWER DATA ID | ... | YYMMDD 0:00 | YYMMDD 0:30 | YYMMDD 1:00 | YYMMDD 1:30 | ... |
|---|---|---|---|---|---|---|
| s1 | 0.50 | 0.53 | 0.60 | 0.65 | 0.42 | ... |
| s2 | 0.55 | 0.65 | 0.62 | 0.71 | 0.78 | ... |
| s3 | 0.60 | 0.51 | 0.44 | 0.40 | 0.37 | ... |
| ... | | | | | | |

FIG. 6

| POWER DISTRIBUTION SECTION ID | ... | YYMMDD 0:00 | YYMMDD 0:30 | YYMMDD 1:00 | YYMMDD 1:30 | ... |
|---|---|---|---|---|---|---|
| I1-2-a | 60 | 63 | 60 | 62 | 58 | ⋮ |
| I1-2-b | 65 | 65 | 62 | 61 | 68 | ⋮ |
| I1-2-c | 60 | 61 | 64 | 60 | 67 | ⋮ |
| I1-3-a | 50 | 53 | 60 | 52 | 58 | ⋮ |
| I1-3-b | 55 | 55 | 52 | 61 | 58 | ⋮ |
| I1-3-c | 51 | 52 | 55 | 57 | 56 | ⋮ |
| ... | | | | | | |

| CONSUMER ID | ... | YYMMDD 0:00 | YYMMDD 0:30 | YYMMDD 1:00 | YYMMDD 1:30 | ... |
|---|---|---|---|---|---|---|
| d1 | 0.50 | 0.53 | 0.60 | 0.65 | 0.42 | ... |
| d2 | 0.55 | 0.65 | 0.62 | 0.71 | 0.78 | ... |
| d3 | 0.60 | 0.51 | 0.44 | 0.40 | 0.37 | ... |
| ... | | | | | | |

28

COMPUTER-READABLE RECORDING MEDIUM STORING TRANSFORMER COUPLING PHASE DETERMINATION PROGRAM, TRANSFORMER COUPLING PHASE DETERMINATION APPARATUS, AND TRANSFORMER COUPLING PHASE DETERMINATION METHOD

CROSS-REFERENCE TO RELATED APPLICATION

This application is based upon and claims the benefit of priority of the prior Japanese Patent Application No. 2021-22770, filed on Feb. 16, 2021, the entire contents of which are incorporated herein by reference.

FIELD

The embodiments discussed herein are related to a non-transitory computer-readable recording medium storing a transformer coupling phase determination program, a transformer coupling phase determination apparatus, and a transformer coupling phase determination method.

BACKGROUND

In the related art, there is proposed a technology of determining which phase of a high-voltage power distribution line a transformer coupled on a secondary side to a consumer who consumes power is coupled to on a primary side.

Japanese Laid-open Patent Publication No. 2017-083397 is disclosed as related art.

SUMMARY

According to an aspect of the embodiments, a non-transitory computer-readable recording medium stores a transformer coupling phase determination program for causing a computer to execute a process including: specifying, based on simulation data, related to an operation of a power distribution facility including a plurality of power distribution lines and one or more transformers coupled to a phase corresponding to a combination of two of the plurality of power distribution lines, for each pattern of the phase to which the transformer is coupled, a correlation relationship between a phase current that is a current flowing through the transformer and a line current that is a current flowing through each of the plurality of power distribution lines; generating a scatter diagram indicating a degree of correlation between the phase current and each of the line currents, based on the simulation data for each pattern and the correlation relationship; calculating a probability density at each position in the scatter diagram, for each pattern; and determining, based on a position in a case where actual data of the phase current and the line current in the operation of the power distribution facility is plotted in the scatter diagram and a calculation result of the probability density, a coupling phase of the transformer in the actual data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating an example of a power distribution information DB;

FIG. 5 is a diagram illustrating an example of a standard power data DB;

FIG. 6 is a diagram illustrating an example of a line current data DB;

FIG. 7 is a diagram illustrating an example of an actual power data DB;

DESCRIPTION OF EMBODIMENTS

For example, there is proposed a coupling phase determination reliability calculation apparatus that calculates reliability for a determination result of a transformer coupling phase under a condition in which correct answer information does not exist. This apparatus calculates each of correlation values indicating a correlation between a phase current caused by power consumed by at least one consumer coupled to a transformer coupled to any of a plurality of phases corresponding to combinations of two of a plurality of power distribution lines and a line current flowing through each of the plurality of power distribution lines. This apparatus determines a phase to which the transformer is coupled, based on each of the correlation values. This apparatus represents a distribution of vectors having each of the correlation values as an element and estimates a mixture distribution model having a plurality of components respectively corresponding to the plurality of phases to calculate reliability of a determination result of the phase to which the transformer is coupled, based on the mixture distribution model.

Meanwhile, in the related art, in a case where the number of pieces of acquirable data is small among pieces of data of the power consumed by the consumer, there is a problem that it is not possible to determine the coupling phase of the transformer with high accuracy. In the estimation of the mixture distribution model, in a case where an initial value of a parameter as an estimation target is not appropriately set, the estimation of the mixture distribution model is unstable. In a case where the coupling phase is determined by using such a mixture distribution model, there is a problem that the coupling phase of the transformer may not be determined with high accuracy.

In one aspect, a technology of the disclosure is to improve accuracy of a determination of a coupling phase of a transformer.

Hereinafter, an example of embodiments of a technology according to the present disclosure will be described in detail with reference to drawings.

Figure 1:
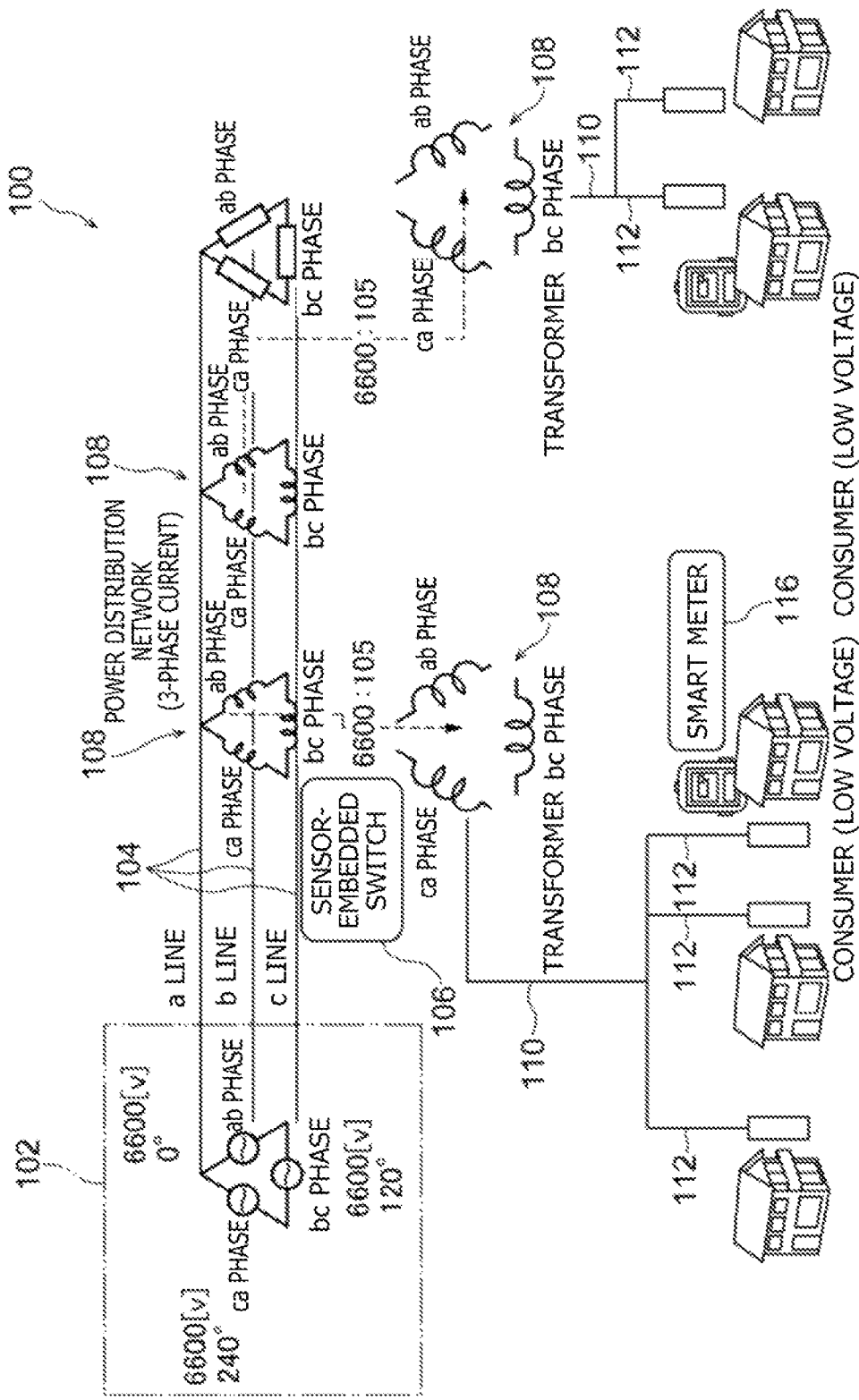
FIG. 1 is a schematic diagram illustrating an example of a power distribution network.

First, an example of a power distribution network will be described with reference to FIG. 1. The power distribution network is an example of a power distribution facility of the disclosed technology. A power distribution network 100 illustrated in FIG. 1 includes a distribution substation 102 that generates alternating current (AC) power of high voltage with 3 phases (for example, 6.6 kV). In the example in FIG. 1, a power distribution system is a 3-phase 3-line system, and one ends of 3 high-voltage power distribution lines 104 are coupled to the distribution substation 102. The 3-phase high-voltage AC power generated by the distribution substation 102 is transmitted through the 3 high-voltage power distribution lines 104. Hereinafter, in a case where the 3 high-voltage power distribution lines 104 are distinguished from each other, the high-voltage power distribution lines 120 are respectively referred to as an a line, a b line, and a c line.

A sensor-embedded switch 106 is installed in the middle of the high-voltage power distribution line 104, and each of a line current $I_a$ of the a line, a line current $I_b$ of the b line, a line current $I_c$ of the c line is measured, for example, in units of 30 minutes by the sensor-embedded switch 106. Hereinafter, in a case where the line currents $I_a$, $I_b$, and $I_c$ are collectively referred to, a reference numeral of a line current $I_x$ (x is any of a, b, and c) is used.

In the high-voltage power distribution line 104, a primary side of a single-phase transformer 108 is coupled to each of a plurality of different positions on the downstream side of an installation position of the sensor-embedded switch 106 in a transmission direction of the AC power. The number of transformers 108 coupled to the high-voltage power distribution line 104 is, for example, approximately several tens to several hundreds. Since the number of high-voltage power distribution lines 104 is 3, there are 3 combinations of the high-voltage power distribution lines 104 to which the transformer 108 is coupled, for example, coupling phases. Although many of the actual transformers 108 are single-phase transformers, the transformers 108 are illustrated as 3-phase transformers in FIG. 1 in order to represent that the transformer 108 may have 3 coupling phases. Hereinafter, the possible coupling phases of the transformer 108 are respectively referred to as an ab phase, a bc phase, and a ca phase.

One ends of a plurality of low-voltage power distribution lines 110 are coupled to secondary sides of the individual transformers 108, and single-phase low-voltage (for example, 105 V) AC power converted by the transformers 108 is transmitted through the plurality of low-voltage power distribution lines 110. Lead-in lines 112 corresponding to individual consumers at a plurality of locations close to the individual consumers are respectively coupled to the low-voltage power distribution line 110. The single-phase low-voltage AC power is supplied to individual consumers via the low-voltage power distribution line 110 and the lead-in line 112. The number of consumers under a distribution of one transformer 108 is, for example, approximately 5 to 10. FIG. 1 illustrates the number of consumers of which corresponding lead-in lines 112 are coupled to the same low-voltage power distribution line 110 coupled to the secondary side of one transformer 108.

A power meter (smart meter 116) having a communication function is installed in some of the consumers. Power consumption P in the consumer at which the smart meter 116 is installed is measured by the smart meter 116, for example, in units of 30 minutes, and a measurement result is transmitted to a power distribution business entity or the like via a communication line (not illustrated).

In a case where the number of consumers at which the smart meter 116 is installed is small, the number of pieces of acquirable data in the power consumption P of the consumers is small. As in the related art, in a case where a mixture distribution model is estimated from a distribution of vectors of correlation values calculated from actual data, the distribution may not be estimated with high accuracy since the number of pieces of the actual data is small. In the related art, since a correct answer coupling phase corresponding to each vector is unknown, in a case where an initial value of a parameter as an estimation target is not appropriately set, the estimation of the mixture distribution model becomes unstable.

Therefore, in the present embodiment, the problem of the number of pieces of data is solved by using simulation data. In the present embodiment, the coupling phase may be set based on the simulation data, for example, the coupling phase may be known. Therefore, a probability density distribution is estimated for each component corresponding to each phase based on the distribution of the vectors of the correlation values, so that the problem that the distribution estimation becomes unstable is solved. Hereinafter, a transformer coupling phase determination apparatus according to the present embodiment will be described in detail.

Figure 2:
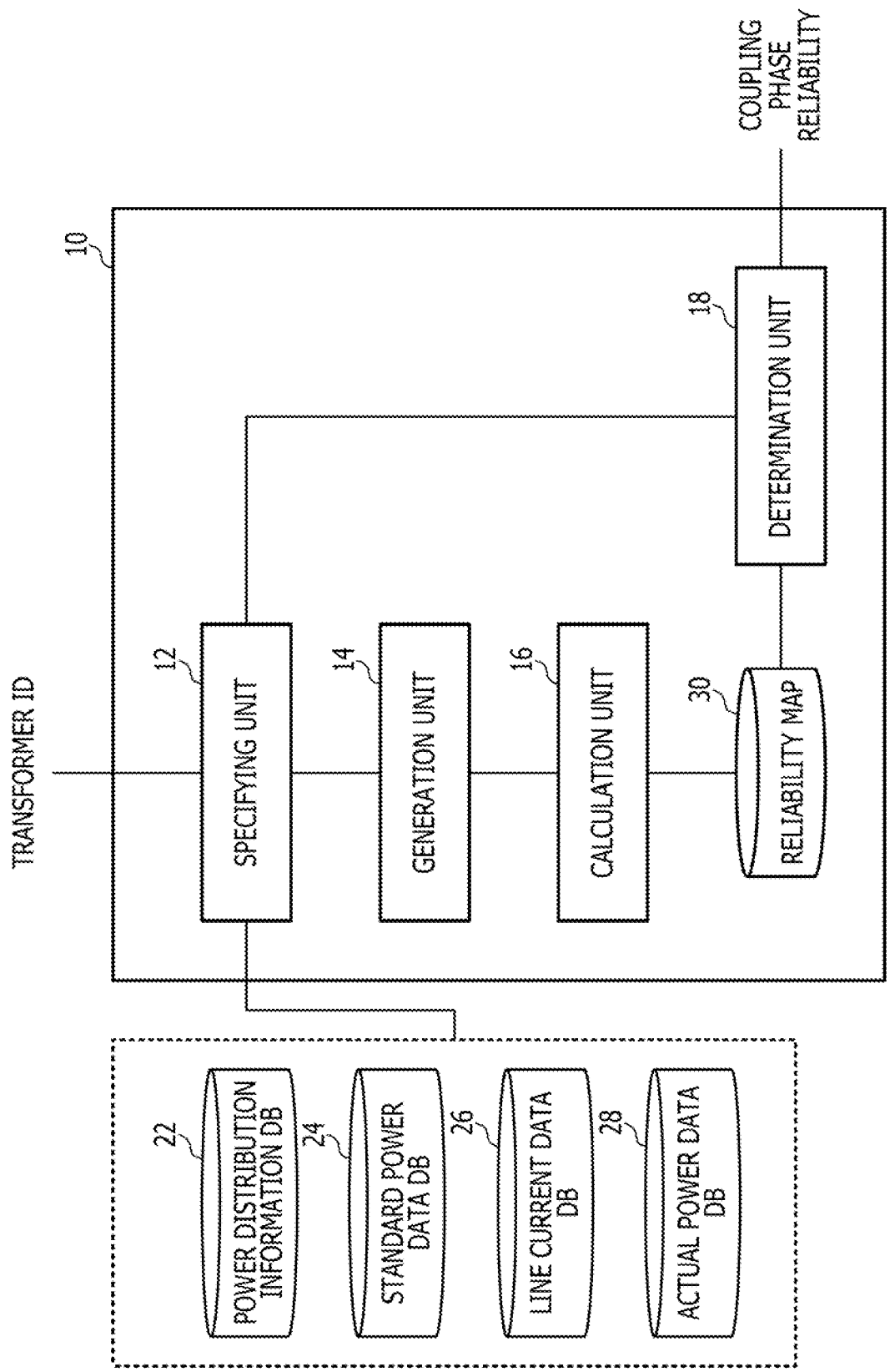
FIG. 2 is a functional block diagram of a transformer coupling phase determination apparatus.

As illustrated in FIG. 2, a transformer coupling phase determination apparatus 10 according to the present embodiment includes a specifying unit 12, a generation unit 14, a calculation unit 16, and a determination unit 18. The specifying unit 12, the generation unit 14, and the calculation unit 16 function when the transformer coupling phase determination apparatus 10 generates a reliability map 30 (details will be described below) to be used for determining a coupling phase of a transformer and calculating reliability of a determination result (hereafter, referred to as "map generation time"). In the transformer coupling phase determination apparatus 10, the specifying unit 12 and the determination unit 18 function when determining the coupling phase of the target transformer (hereafter, referred to as "coupling phase determination time").

At the map generation time, regarding an operation of the power distribution facility, based on simulation data for each pattern of phases to which transformers are coupled, the specifying unit 12 specifies a correlation relationship between a phase current that is a current flowing in the transformer and a line current that is a current flowing in each of a plurality of power distribution lines. At the coupling phase determination time, the specifying unit 12 specifies a correlation relationship between the phase current and the line current, based on actual data of the phase current and the line current. Hereinafter, processes of the specifying unit 12 will be specifically described.

At the map generation time, the specifying unit 12 accepts, as an input, a transformer ID which is identification information of a transformer as a generation target of simulation data which will be described below, and selects a power distribution section corresponding to the transformer ID. At the coupling phase determination time, the specifying unit 12 accepts, as an input, a transformer ID of a transformer which is a coupling phase determination target, and selects a power distribution section and a consumer corresponding to the transformer ID.

Figure 3:
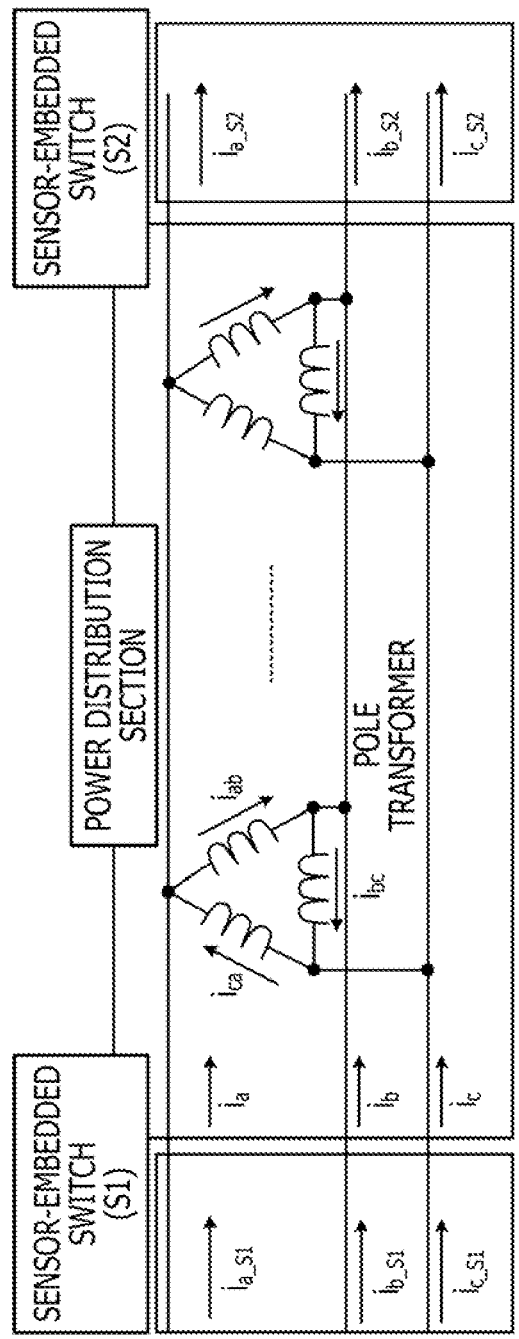
FIG. 3 is a diagram in which a power distribution system is represented by a virtual circuit configuration.

The power distribution section will be described. For example, a power distribution system as illustrated in FIG. 3 is considered. The example in FIG. 3 is a 3-phase 3-line circuit, and a transformer (pole transformer) is a 3-phase transformer virtually coupled in a triangular manner. In many of transformers in an actual power distribution system, a single-phase 3-line type or a single-phase 2-line type transformer is used, and only one phase is normally used. In FIG. 3, the power distribution system is represented by a virtual circuit configuration in order to handle a possibility that a plurality of coupling phases exist. In the present embodiment, a section sandwiched between 2 sensor-embedded switches is referred to as a "power distribution section". As described above, the consumer is coupled to the secondary side of the transformer.

A correspondence relationship between a power distribution section and a transformer belonging to the power distribution section and a correspondence relationship between the transformer and a consumer coupled to the transformer are stored as power distribution information in a power distribution information DB (database) 22.

FIG. 4 illustrates an example of a power distribution information DB 22. In the example in FIG. 4, the power distribution information DB 22 stores, for each consumer, power distribution information including information each of a "consumer ID", a "transformer ID", a "power distribution section ID", and a "data availability flag". The consumer ID is identification information of a consumer. The transformer ID is a transformer ID of a transformer to which the consumer is coupled. The power distribution section ID is identification information of a power distribution section to which the transformer belongs. As illustrated in FIG. 3, a power distribution system is assumed in which a number of power distribution sections sandwiched between sensor-embedded switches installed on an upstream side and a downstream side of the power distribution system are coupled in series. For example, the power distribution section ID indicating the power distribution section sandwiched between a sensor-embedded switch (S1) and a sensor-embedded switch (S2) is determined as I1-2". The data availability flag is a flag indicating whether or not power consumption data of each consumer is available. For example, in a case where a power meter such as a smart meter installed in a consumer is coupled to the transformer coupling phase determination apparatus 10 via a network, it is determined that power consumption data of the consumer is available, and the data availability flag is set to "Y".

Therefore, the specifying unit 12 refers to the power distribution information stored in the power distribution information DB 22 to select a power distribution section corresponding to the accepted transformer ID or the power distribution section and a consumer. For example, at the map generation time, the specifying unit 12 selects a power distribution section ID associated with a transformer ID that coincides with the accepted transformer ID. At the coupling phase determination time, the specifying unit 12 selects a power distribution section ID and a consumer ID associated with the transformer ID that coincides with the accepted transformer ID. When selecting the consumer ID, the specifying unit 12 selects a consumer ID having a data availability flag of "Y". In a case where there are a plurality of corresponding consumer IDs, the specifying unit 12 selects the plurality of consumer IDs.

At the map generation time, the specifying unit 12 sets any of the 3 types of phases as a coupling phase for a transformer indicated by the accepted transformer ID and generates simulation data related to the transformer. The simulation data includes data of a phase current generated in the set coupling phase, caused power consumed by a virtual consumer (hereafter, referred to as a "virtual consumer") coupled to the transformer. The simulation data includes data of a line current for each power distribution line in which a variation caused by the phase current obtained by the simulation is reflected in the line current which is actual data.

For example, the specifying unit 12 generates data of power consumed by the virtual consumer (hereafter, referred to as "power consumption data") by using standard power data stored in a standard power data DB 24. FIG. 5 illustrates an example of the standard power data DB 24. As illustrated in FIG. 5, the standard power data is data of power consumption [kWh] per time interval (30 minutes in the example illustrated in FIG. 5) corresponding to a sampling time interval of the smart meter 116. In the example in FIG. 5, a standard power data ID that is identification information of the standard power data is assigned to each standard power data. For an unspecified large number of consumers, the standard power data may be data of power consumption actually measured by the smart meter 116 in the past, may be an average value of the power consumption, or may be data created manually or by a predetermined simulation or the like.

The specifying unit 12 acquires a predetermined number of pieces of standard power data from the standard power data DB 24, and adds the power consumption for each sampling time to generate the power consumption data of the virtual consumer. The specifying unit 12 calculates a phase current caused by the generated power consumption of the virtual consumer, for the set coupling phase. For example, in a case where a transformer having a high voltage of 6600 V is assumed, time-series data $I'^y_s(t)$ of a phase current caused by time-series data $P'_s(t)$ of power consumption of a virtual consumer s is calculated by the following equation (1).

$$I'^y_s(t) = P'_s(t)/6.6 \qquad (1)$$

$y \in \{ab, bc, ca\}$ y is a set coupling phase, and is any of the ab phase, the bc phase, and the ca phase. $P'_s(t)$ is time-series data [kWh] of power consumption of the virtual consumer s, and $I'^y_s(t)$ is time-series data [A] of a phase current of a y phase caused by the power consumption.

The specifying unit 12 calculates a line current for each power distribution line, based on the phase current and a circuit configuration of the power distribution facility. For example, the specifying unit 12 acquires, from a line current data DB 26, 3 types of line currents in a power distribution section indicated by a power distribution section ID selected based on the accepted transformer ID. FIG. 6 illustrates an example of the line current data DB 26. In the example in FIG. 6, a net current value [A] measured at regular sampling time intervals (30 minutes in the example in FIG. 6) is accumulated as time-series data of a line current in each of the a line, the b line, and the c line of the power distribution section indicated by the power distribution section ID. In a case where the line current $I'_x(t)$ flowing a net section in each power distribution section as illustrated in FIG. 3 is obtained from a measurement value of a sensor-embedded switch, when an amplitude of the line current is in phase, the amplitude may be treated as a real number. Therefore, as in the following equation (2), the line current $I'_x$ (t) is obtained by subtracting a measurement value in the downstream sensor-embedded switch (S2) from a measurement value in the upstream sensor-embedded switch (S1). In a case where the power distribution section has only one sensor-embedded switch, $I'_{x\_S2}$ (t)=0 may be set in the following equation (2).

$$I'_x(t)=I'_{x\_S1}(t)-I'_{x\_S2}(t) \quad (2)$$

$x \in \{a, b, c\}$

The specifying unit 12 assumes that the power distribution system is a symmetrical 3-phase AC, and performs approximation calculation as the following equation (3), according to a coupling phase in which a new value $I''_x$ (t) of the line current in a case where a virtual consumer is added is set.

ab phase (3)

$$ab \text{ coupling} \begin{cases} I''_a(t) = I'_a(t) + \frac{\sqrt{3}}{2} I'^{ab}_s(t) \\ I''_b(t) = I'_b(t) + \frac{\sqrt{3}}{2} I'^{ab}_s(t) \\ I''_c(t) = I'_c(t) \end{cases}$$

bc phase $$bc \text{ coupling} \begin{cases} I''_a(t) = I'_a(t) \\ I''_b(t) = I'_b(t) + \frac{\sqrt{3}}{2} I'^{bc}_s(t) \\ I''_c(t) = I'_c(t) + \frac{\sqrt{3}}{2} I'^{bc}_s(t) \end{cases}$$

ca phase $$ca \text{ coupling} \begin{cases} I''_a(t) = I'_a(t) + \frac{\sqrt{3}}{2} I'^{ca}_s(t) \\ I''_b(t) = I'_b(t) \\ I''_c(t) = I'_c(t) + \frac{\sqrt{3}}{2} I'^{ca}_s(t) \end{cases}$$

In the generation of the simulation data, the specifying unit 12 may adjust a distribution of the coupling phase set for each transformer. For example, the specifying unit 12 may equally distribute 3 types of coupling phases to the plurality of transformers, or may increase or decrease the number of settings of any of the coupling phases. The specifying unit 12 may adjust a coefficient for generating power consumption data of the virtual consumer from the standard power data. For example, when a plurality of pieces of standard power data are added to generate the power consumption data of the virtual consumer, the power consumption data may be generated as a weighted sum of each standard power data. Only power consumption in a specific time zone of the standard power data may be multiplied by a coefficient to generate the power consumption data of the virtual consumer. The specifying unit 12 may adjust a distribution of a load on the 2 power distribution lines corresponding to the coupling phase of the transformer. The specifying unit 12 may perform these adjustments, based on a result of statistical analysis of acquirable information in advance for the power distribution facility to which the transformer as a determination target belongs.

The specifying unit 12 processes the calculated time-series data $I''_x$ (t) of the line current and the calculated time-series data $I'^y_s$ (t) of the phase current with values represented by fluctuations from a time average to perform correlation analysis, as indicated by the following equation (4).

$$I_x(t)=I''x(t)-\mu(I''x(t))$$

$$x \in \{a,b,c\} I^y_s(t)=I'^y_s(t)=I'^y_s(t)-\mu(I'^y_s(t)) \quad (4)$$

$y \in \{ab, bc, ca\}$ ($\mu(\bullet)$ is a time average)

The specifying unit 12 calculates a correlation coefficient $\rho_{xs}^y$ indicated by the following equation (5), for example, as an index value indicating a correlation relationship between the time-series data $I_x$ (t) of the line current and the time-series data $I^y_s$ (t) of the phase current.

$$\rho_{xs}^y = \frac{\sigma_{xs}^y}{\sigma_x \sigma_s^y} = \frac{\frac{1}{T}\sum_{t=1}^{T} I_x(t)I^y_s(t)}{\sqrt{\frac{1}{T}\sum_{t=1}^{T} I_x(t)^2}\sqrt{\frac{1}{T}\sum_{t=1}^{T} I^y_s(t)^2}} \quad (5)$$

$(-1 \le \rho_{xs}^y \le 1)$.

$\sigma_{xs}^y$ is a covariance of $I_x$ (t) and $I_s^y$ (t), $\sigma_x$ is a standard deviation of $I_x$ (t), $\sigma_s^y$ is a standard deviation of $I_s^y$ (t), and T is the number of sampling points in time-series data.

At the coupling phase determination time, the specifying unit 12 acquires power consumption data corresponding to a consumer ID selected based on the accepted transformer ID from an actual power data DB 28. FIG. 7 illustrates an example of the actual power data DB 28. The actual power data DB 28 has the same data structure as the standard power data DB 24 illustrated in FIG. 5, and data of the actual power data DB 28 is a value of power consumption of a consumer actually measured by the smart meter 116. In a case where the number of selected consumer IDs is 1, the specifying unit 12 may read the power consumption data corresponding to the consumer ID from the actual power data DB 28 as it is. In a case where there are a plurality of selected consumer IDs, the specifying unit 12 acquires a plurality of pieces of power consumption data corresponding to a plurality of consumer IDs, adds the power consumption for each sampling time, and generates power consumption data of a consumer actually coupled to the transformer (hereafter, referred to as "actual consumer"). The specifying unit 12 calculates time-series data $I_d$ (t) of the phase current caused by time-series data $P_d$ (t) of power consumption of an actual consumer d, in the same manner as in the equations (1) and (4).

The specifying unit 12 acquires time-series data $I_x$ (t) ($x \in \{a, b, c\}$) of 3 types of line currents corresponding to a power distribution section ID selected based on the accepted transformer ID, from the line current data DB 26. The specifying unit 12 calculates a correlation coefficient $\rho_{xd}$ between the calculated time-series data $I_d$ (t) of the phase current and the acquired time-series data $I_x$ (t) of the phase current, in the same manner as in the equation (5). "s (virtual consumer)" in the equations (1), (4), and (5) is replaced with "d (actual consumer)". Since a coupling phase of the transformer as a determination target is unknown, "y" in the equations (1), (4), and (5) is also unknown. Thus, the superscript "y" is deleted from the symbol of each data related to the transformer as a determination target.

The generation unit 14 generates a scatter diagram indicating the degree of correlation between the phase current and each of the line currents, based on the simulation data for each transformer in which a coupling phase is set and the correlation relationship between the phase current and the line current specified by the specifying unit 12. For example, the generation unit 14 projects a distribution of vectors having the 3 correlation coefficients $\rho_{xs}^{y}$ {x∈a, b, c} for the phase current and each of the line currents, which are calculated for each transformer, as elements, onto a plane having vectors symmetrical to axes corresponding to the respective correlation coefficients, as normal vectors.

For example, the generation unit 14 represents a correlation coefficient vector ρ (bold letter in the mathematical equation) having 3 types of correlation coefficients as elements by a coordinate system ($\rho_{as}$, $\rho_{bs}$, $\rho_{cs}$) introduced by the following equation (6). $e_a$, $e_b$, and $e_c$ (e is a bold letter in the mathematical equation) is a basis of 3 axes.

$$\rho = \rho_{as} e_a + \rho_{bs} e_b + \rho_{cs} e_c \tag{6}$$

Figure 8:
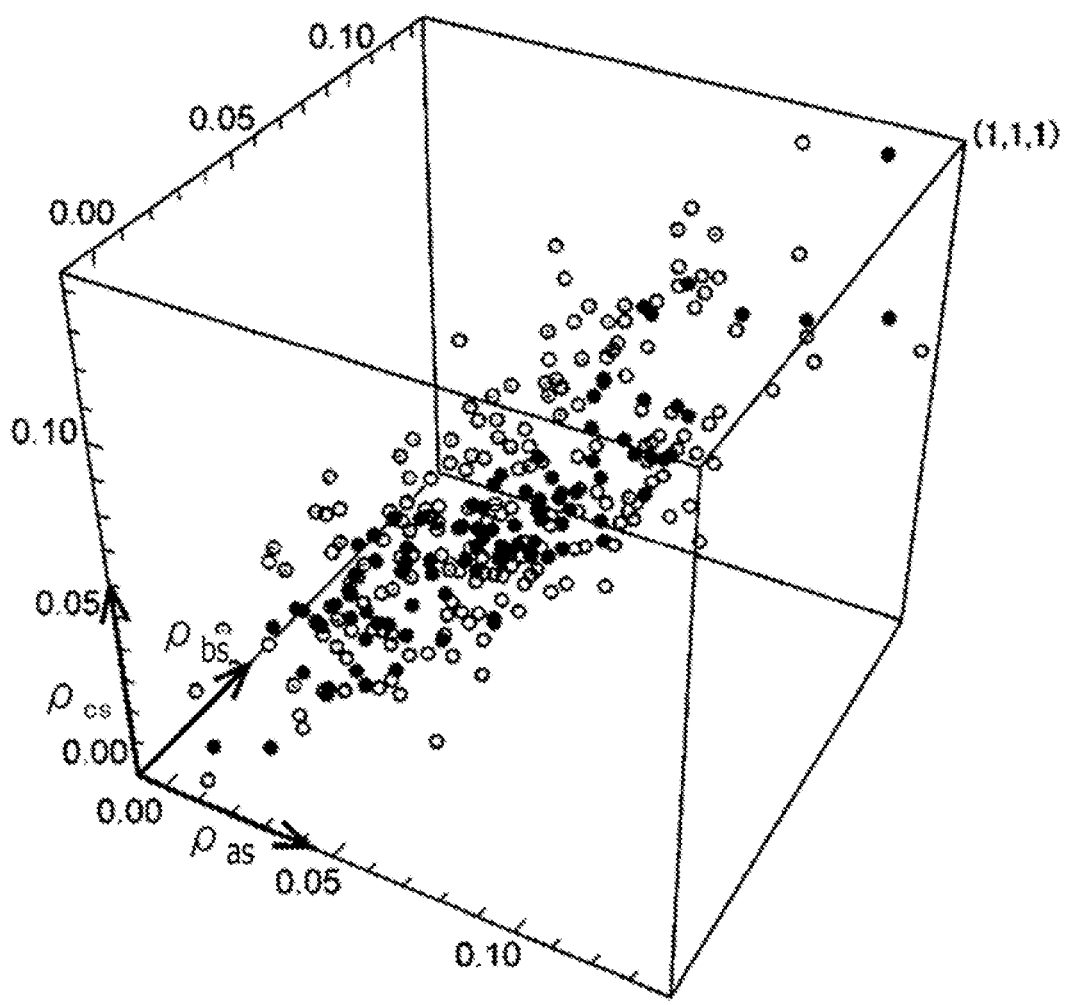
FIG. 8 is a diagram illustrating a distribution of correlation coefficient vectors.

FIG. 8 illustrates an example in which a correlation coefficient vector obtained for each of many transformers is depicted as a three-dimensional scatter diagram. Each point in FIG. 8 corresponds to the correlation coefficient vector calculated based on simulation data generated for each selected transformer ID. In FIG. 8, shading of each point varies depending on a type of a coupling phase set in a transformer corresponding to each point.

Figure 9:
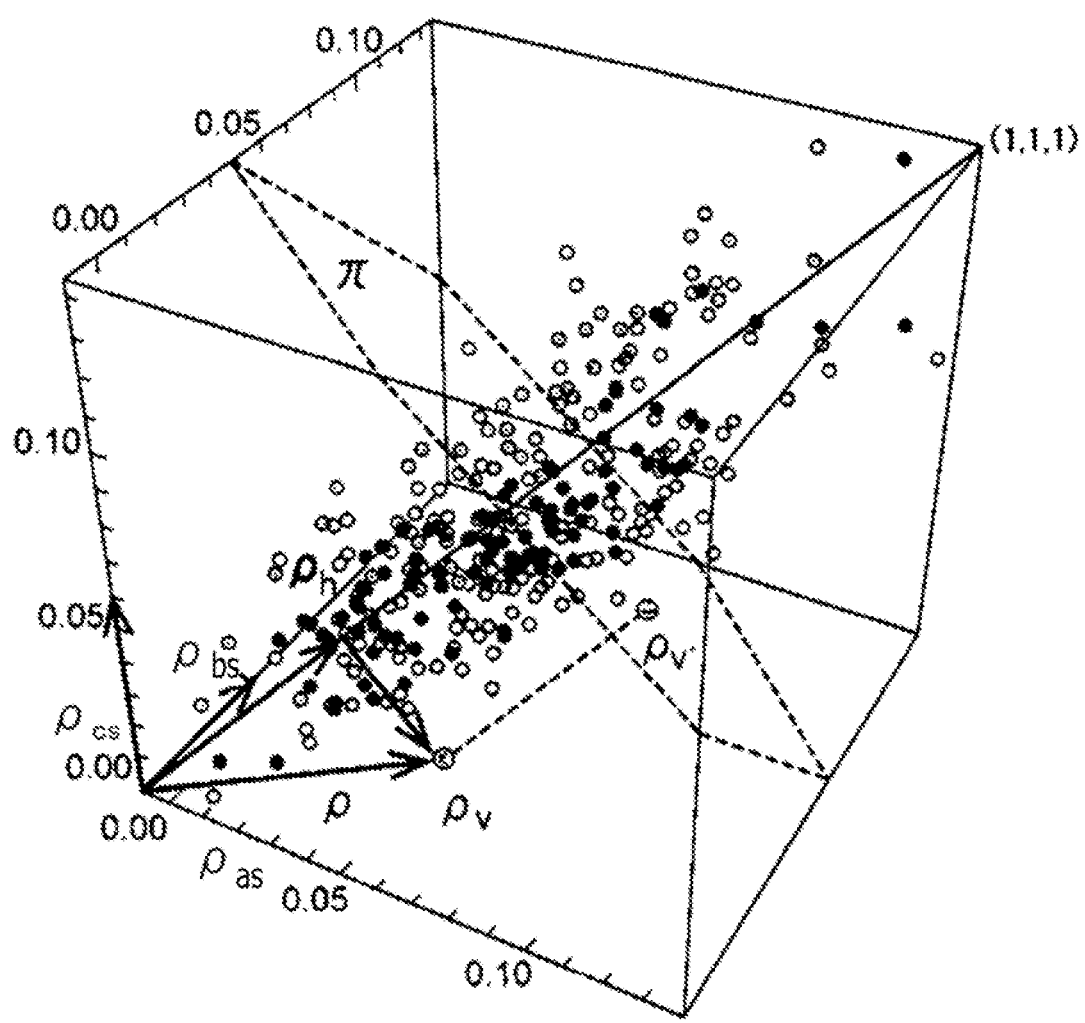
FIG. 9 is a diagram illustrating projection of the correlation coefficient vector to a plane n.

The generation unit 14 orthogonally projects all samples of the correlation coefficient vectors over a plane n having a normal vector in a (1, 1, 1) direction in a space of the correlation coefficient vector illustrated in FIG. 8. As illustrated in FIG. 9, when any correlation coefficient vector p is decomposed into a vector $\rho_h$ parallel to (1, 1, 1) and a vector $\rho_v$ parallel to a plane n, a point obtained by orthogonal projection of a point corresponding to n, which is a three-dimensional vector, to the plane n may be represented by $\rho_v'$, which is a two-dimensional vector.

Figure 10:
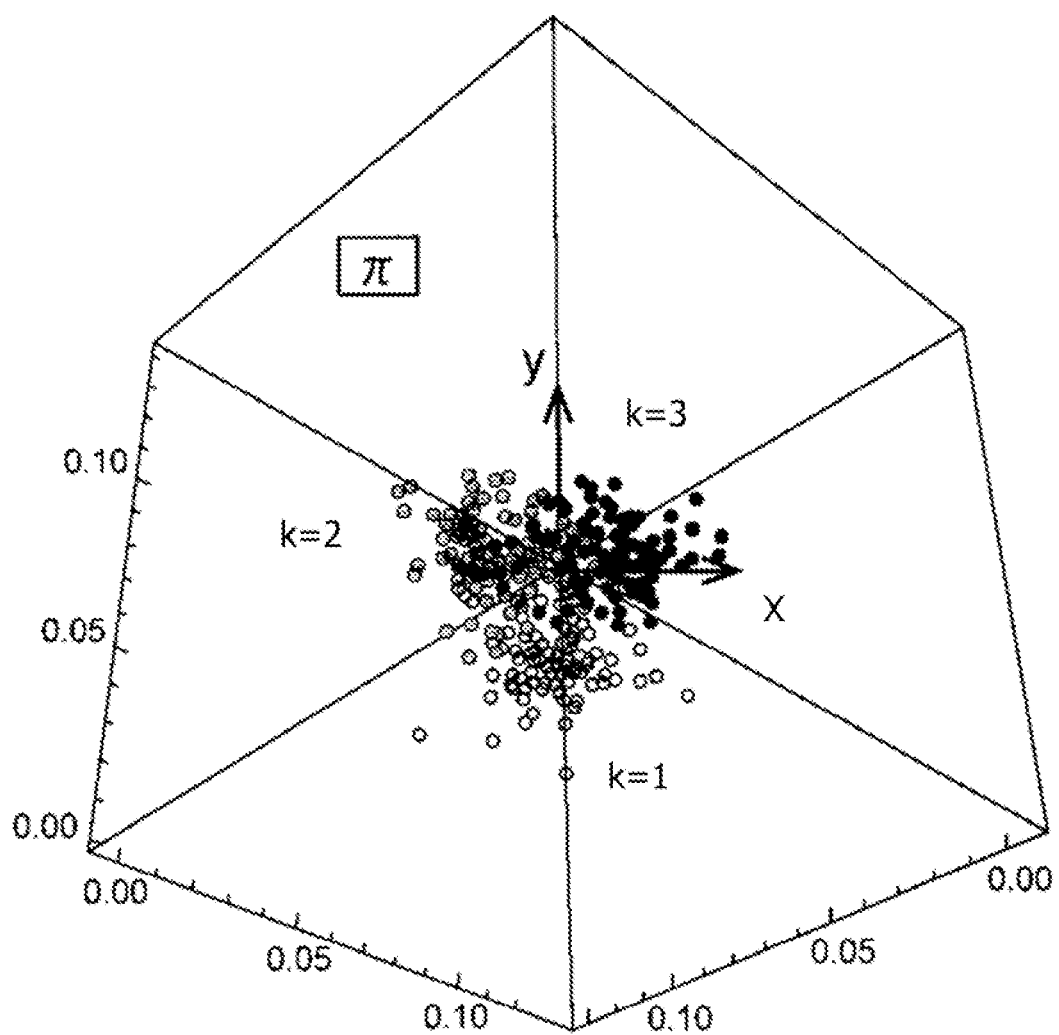
FIG. 10 is a diagram illustrating the projection of the correlation coefficient vector to the plane n.

In order to represent the vector $\rho_v'$ illustrated in FIG. 9 in a two-dimensional manner over the plane n, when a coordinate system (x, y) as illustrated in FIG. 10 is set, orthogonal projection to the plane n may be defined by linear transformation as in the following equation (7).

$$\begin{pmatrix} x \\ y \end{pmatrix} = \begin{pmatrix} \frac{\sqrt{3}}{2} & -\frac{\sqrt{3}}{2} & 0 \\ -\frac{1}{2} & -\frac{1}{2} & 1 \end{pmatrix} \begin{pmatrix} \rho_{as}^y \\ \rho_{bs}^y \\ \rho_{cs}^y \end{pmatrix} \tag{7}$$

For example, the generation unit 14 uses the equation (7) described above to generate a two-dimensional scatter diagram of correlation coefficients between time-series data of a phase current and time-series data of a line current, which are simulation data.

The calculation unit 16 calculates a probability density of each position in the two-dimensional scatter diagram generated by the generation unit 14 for each pattern (type) of a coupling phase. For example, the calculation unit 16 estimates a density function for a distribution for each component corresponding to a pattern of a correlation coefficient vector projected onto the plane n. The component corresponds to a set of sample points for each pattern of the set coupling phase. In the example in FIG. 10, k is a number of the component, and k=1, 2, 3 indicates components respectively corresponding to the ab phase, the bc phase, and the ca phase in this order.

For example, a mixed normal distribution in which a two-dimensional normal distribution is assumed for each component of the two-dimensional scatter diagram generated by the generation unit 14 is represented by using coordinates (x, y) as the following equation (8).

$$f(x, y) = \sum_{k=1}^{3} \tau_k f_k(x, y) \tag{8}$$
$$= \sum_{k=1}^{3} \tau_k \frac{1}{(\sqrt{2\pi})^2 \sqrt{|S_k|}} \exp\left\{-\frac{1}{2}\left(\begin{pmatrix} x \\ y \end{pmatrix} - \mu_k\right)^T S_k^{-1} \left(\begin{pmatrix} x \\ y \end{pmatrix} - \mu_k\right)\right\}$$

$\tau_k$ is a mixture ratio, $\mu_k$ (bold letters in the mathematical equation) is a mean vector, $S_k$ is a variance covariance matrix, and |•| is a determinant. In the present embodiment, since the coupling phase is set in the simulation, it is known which phase each sample point in the scatter diagram corresponds to a correlation coefficient vector between a line current and a phase current for a transformer coupled to. Therefore, the calculation unit 16 estimates $\mu_k$ and $S_k$, which are parameters in the equation (8), for each component (k=1, 2, 3) by a maximum likelihood method or the like, and determines a density function $f_k$ (x, y) of each component.

The calculation unit 16 estimates the mixture ratio $\tau_k$ (k=1, 2, 3), which is a parameter in the equation (8) described above, by an EM algorithm or the like, based on the density function $f_k$ (x, y) (k=1, 2, 3) of each component and actual data of the line current and the phase current. Thus, f (x, y) in the equation (8) is determined, and a probability density in the two-dimensional scatter diagram, for example, at each position (x, y) on the plane n is calculated.

f (x, y) is not limited to the case of assuming the equation (8) described above, and the equation indicated in the following equation (9) assuming a general distribution for each component may be applied. In the present embodiment, since the sample points belonging to each component are known, it is also easy to execute nonparametric estimation without limiting a type of distribution. Thus, it is possible to estimate the mixture distribution that more accurately represents the distribution of the sample points in the two-dimensional scatter diagram.

$$f(x,y) = \Sigma_{k=1}^{3} \tau_k f_k(x,y) \tag{9}$$

In the case of equation (9), for each component (k=1, 2, 3), the calculation unit 16 estimates the density function $f_k$ (x, y) of the component by a kernel density estimation method or the like. In the same manner as the case of equation (8), the calculation unit 16 estimates the mixture ratio $\tau_k$ with the EM algorithm or the like, by using the actual data of the line current and the phase current.

The calculation unit 16 uses the estimated $f_k$ (x, y) and $\tau_k$ (k=1, 2, 3) to calculate a determination equation for the coupling phase indicated by the following equation (10) and reliability indicated by the following equation (11).

$$k^* = \arg\max_{k}(\tau_k f_k(x, y)) \tag{10}$$

$$C(x, y, k^*) = \frac{\tau_k * f_k * (x, y)}{\sum_{k=1}^{3} \tau_k f_k(x, y)} \tag{11}$$

Figure 11:
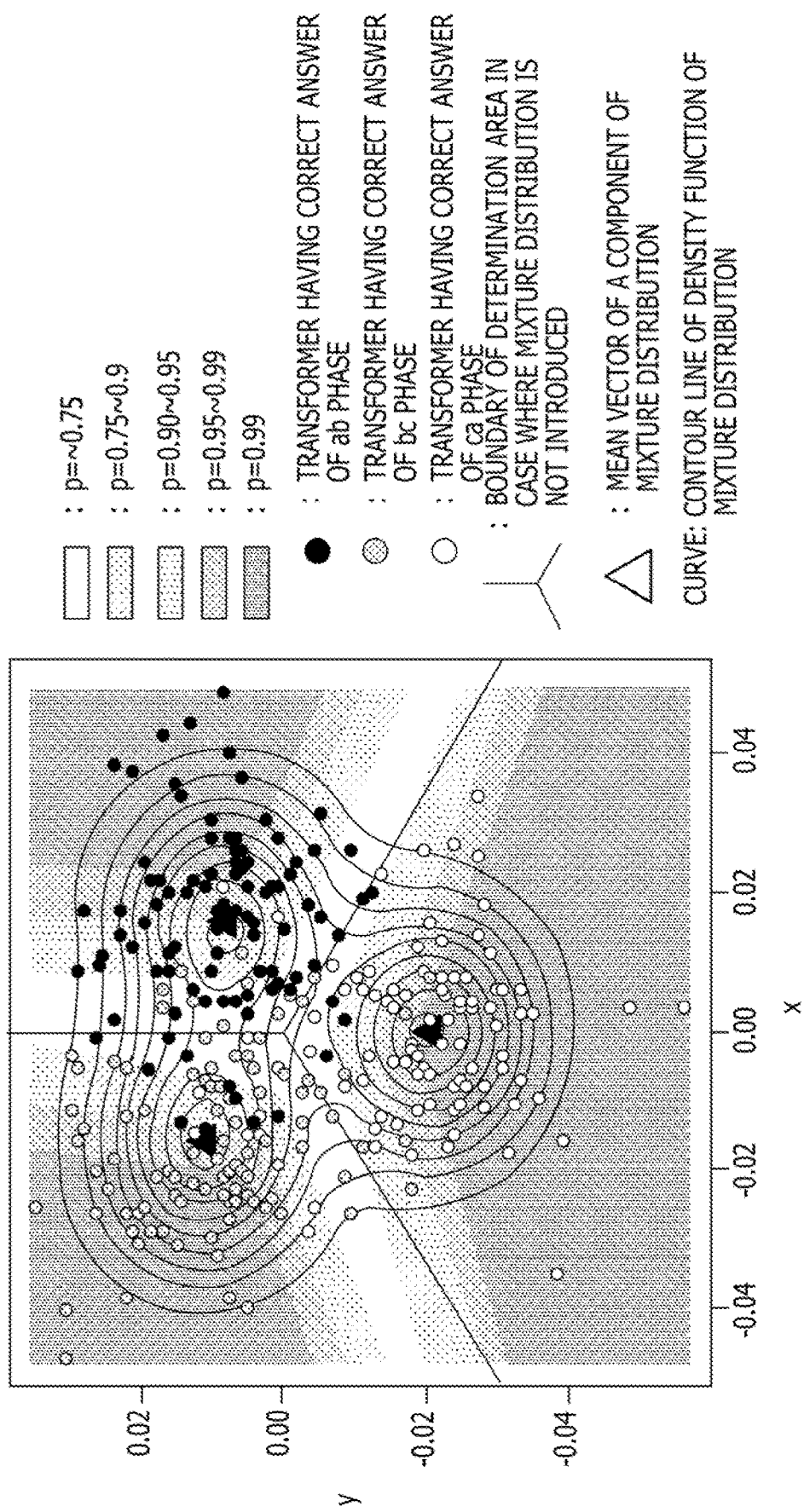
FIG. 11 is a diagram conceptually illustrating an example of a reliability map.

The equation (10) represents that, for a transformer of which sample point is located at a point (x, y) over the plane n, a pattern corresponding to a component k (k*) with which $\tau_k f_k$ (x, y) is greatest is determined as a coupling phase of the transformer. The equation (11) is reliability of a determination result in which the component k* is set as the coupling phase. For each position (x, y) over the plane n, the calculation unit 16 generates the reliability map 30 in which the component k* calculated by the equation (10) and the reliability C (x, y, k*) calculated by the equation (11) are associated with each position (x, y). FIG. 11 conceptually illustrates an example of the reliability map 30. In FIG. 11, the high and low degrees of reliability at respective positions over the plane n are represented by gray shading to represent a distribution. In the example in FIG. 11, sample points (circles) in a two-dimensional scatter diagram, a boundary of determination areas in a case where the mixture distribution is not introduced, and contour lines of a density function of the mixture distribution are also illustrated.

The determination unit 18 determines the coupling phase of the transformer as a determination target, based on a position in a case where points based on the actual data of the phase current and the line current related to the transformer as a determination target are plotted in the reliability map 30 and a calculation result of a probability density. For example, at the coupling phase determination time, the determination unit 18 converts a correlation coefficient vector having the 3 correlation coefficients $\rho_{xd}\{x \in a, b, c\}$ calculated for the transformer as a determination target as elements by the specifying unit 12 into a two-dimensional manner according to the equation (7) described above, and plots the correlation coefficient vector in the reliability map 30. The determination unit 18 determines the coupling phase of the transformer as a determination target, based on the component $k^*$ associated with the plotted position (x, y) in the reliability map 30. The determination unit 18 acquires reliability of the determination result, based on C (x, y, $k^*$) associated with the plotted position (x, y) in the reliability map 30.

The determination unit 18 processes and outputs the determination result and the reliability of the coupling phase in a form that may be displayed on a display apparatus, printed by a printing apparatus, or the like.

Figure 12:
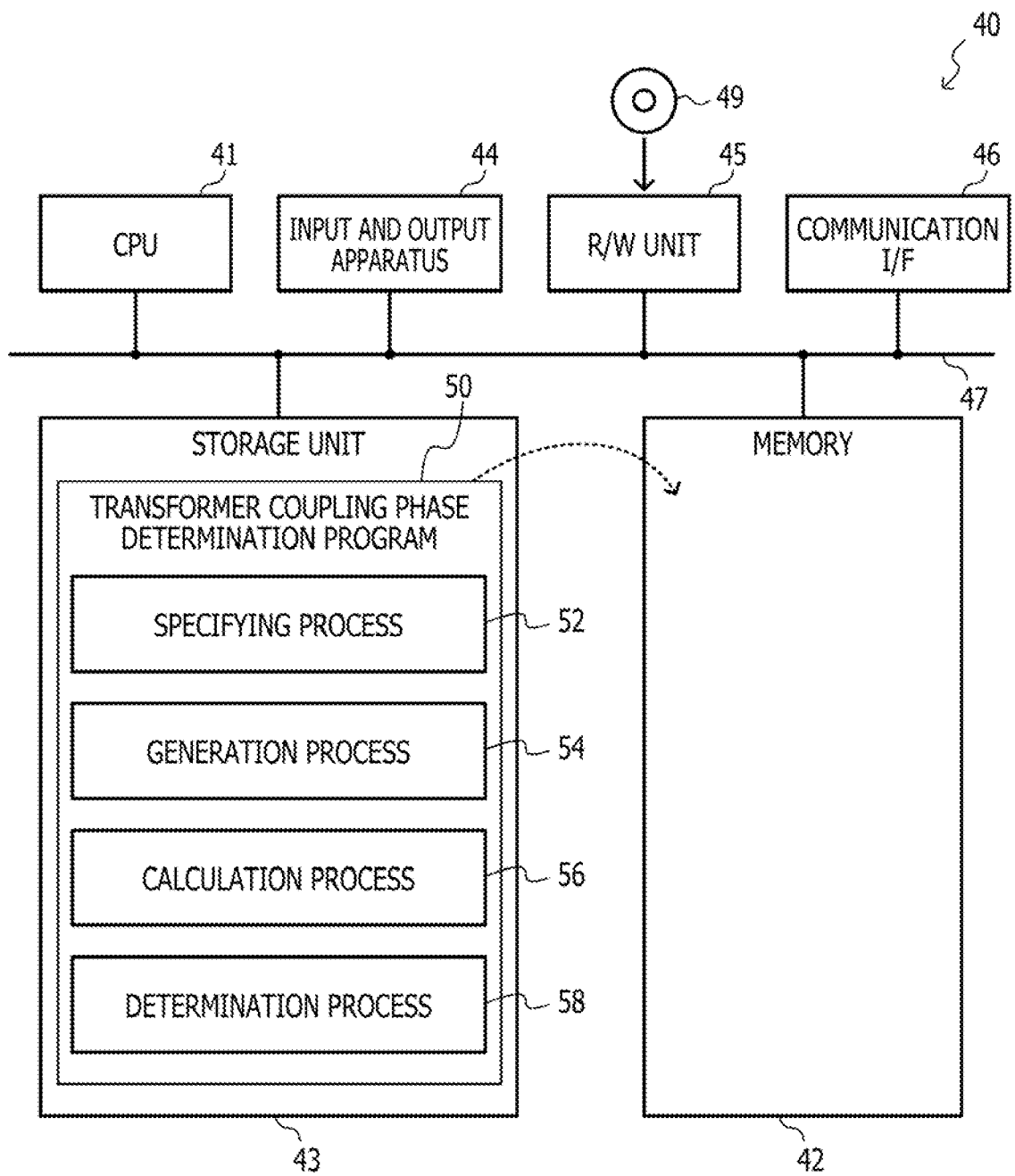
FIG. 12 is a block diagram illustrating a schematic configuration of a computer that functions as the transformer coupling phase determination apparatus.

The transformer coupling phase determination apparatus 10 may be implemented by, for example, a computer 40 illustrated in FIG. 12. The computer 40 includes a central processing unit (CPU) 41, a memory 42 serving as a temporary storage area, and a storage unit 43, which is nonvolatile. The computer 40 also includes an input and output apparatus 44 such as an input unit, a display unit, and the like, and a read/write (R/W) unit 45, which controls reading and writing of data from and to a storage medium 49. The computer 40 also includes a communication interface (I/F) 46, which is coupled to a network such as the Internet. The CPU 41, the memory 42, the storage unit 43, the input and output apparatus 44, the R/W unit 45, and the communication I/F 46 are coupled to each other via a bus 47.

The storage unit 43 may be achieved by a hard disk drive (HDD), a solid-state drive (SSD), a flash memory, or the like. The storage unit 43 as a storage medium stores a transformer coupling phase determination program 50 that causes the computer 40 to function as the transformer coupling phase determination apparatus 10. The transformer coupling phase determination program 50 includes a specifying process 52, a generation process 54, a calculation process 56, and a determination process 58.

The CPU 41 reads the transformer coupling phase determination program 50 from the storage unit 43 and loads the transformer coupling phase determination program 50 into the memory 42, and sequentially executes processes included in the transformer coupling phase determination program 50. The CPU 41 operates as the specifying unit 12 illustrated in FIG. 2 by executing the specifying process 52. The CPU 41 also operates as the generation unit 14 illustrated in FIG. 2 by executing the generation process 54. The CPU 41 executes the calculation process 56 to operate as the calculation unit 16 illustrated in FIG. 2. The CPU 41 also operates as the determination unit 18 illustrated in FIG. 2 by executing the determination process 58. Thus, the computer 40 that executes the transformer coupling phase determination program 50 executes a map generation process and a coupling phase determination process which will be described below, and functions as the transformer coupling phase determination apparatus 10. The CPU 41 that executes the program is hardware.

The functions enabled by the transformer coupling phase determination program 50 may also be enabled by, for example, a semiconductor integrated circuit, more specifically, an application-specific integrated circuit (ASIC) or the like.

Next, an action of the transformer coupling phase determination apparatus 10 according to the present embodiment will be described. When the transformer coupling phase determination apparatus 10 is instructed to generate the reliability map 30 and a transformer ID of a transformer as a generation target of the reliability map 30 is input, the transformer coupling phase determination apparatus 10 executes the map generation process illustrated in FIG. 13. When the transformer coupling phase determination apparatus 10 is instructed to determine a coupling phase of the transformer in a state in which the reliability map 30 is generated, and the transformer ID of the transformer as a determination target is input, the transformer coupling phase determination apparatus 10 executes the coupling phase determination process illustrated in FIG. 15. The map generation process and the coupling phase determination process are examples of a transformer coupling phase determination method of the disclosed technology. Each of the map generation process and the coupling phase determination process will be described below.

Figure 13:
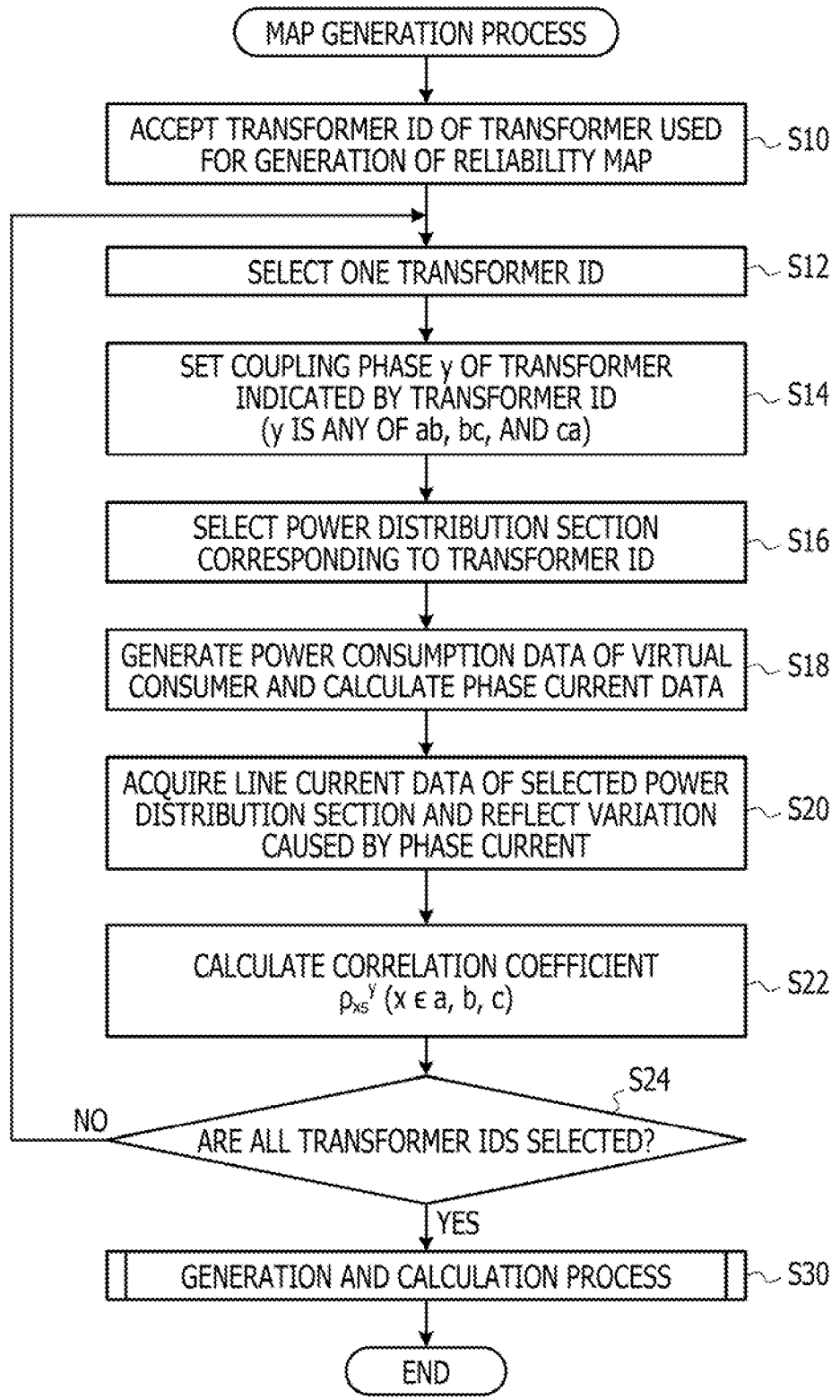
FIG. 13 is a flowchart illustrating an example of a map generation process.

First, the map generation process illustrated in FIG. 13 will be described.

In step S10, the specifying unit 12 accepts an input transformer ID. A plurality of transformer IDs are accepted. Next, in step S12, the specifying unit 12 selects one transformer ID from the accepted transformer IDs. Next, in step S14, the specifying unit 12 sets any phase of an ab phase, a bc phase, and a ca phase as a coupling phase y of the transformer indicated by the selected transformer ID so as to generate simulation data.

Next, in step S16, the specifying unit 12 selects, from the power distribution information DB 22, a power distribution section ID associated with the transformer ID that coincides with the transformer ID selected in step S12.

Next, in step S18, the specifying unit 12 acquires a predetermined number of pieces of standard power data from the standard power data DB 24, adds power consumption for each sampling time to generate the time-series data $P'_s$ (t) of the power consumption of the virtual consumer s. The specifying unit 12 calculates the time-series data $I'^y_s$ (t) of a phase current caused by the time-series data $P'_s$ (t) of the power consumption of the virtual consumer s by, for example, the equation (1).

Next, in step S20, the specifying unit 12 acquires, from the line current data DB 26, time-series data $I'_x$ (t) of 3 types of line currents in a power distribution section indicated by the power distribution section ID selected in step S16. The specifying unit 12 calculates the time-series data $I''_x$ (t) of the line current obtained by reflecting a variation caused by the phase current of the time-series data $I'^y_s$ (t) calculated in step S18 in the time-series data $I'_x$ (t) of the line current. The specifying unit 12 assumes that the power distribution system is a symmetrical 3-phase AC, and calculates the time-series data $I''_x$ (t) of the line current by, for example, the equation (3).

Next, in step S22, the specifying unit 12 calculates the time-series data $I_x$ (t) of the line current and the time-series data $I_s^y$ (t) of the phase current obtained by representing each of $I''_x$ (t) and $I'^y_s$ (t) by a variation from a time average, by the equation (4), for example. The specifying unit 12 calculates the correlation coefficient $\rho_{xs}^y$ {x∈a, b, c} between the time-series data $I_x$ (t) of the line current and the time-series data $I_s^y$ (t) of the phase current, which are indicated by, for example, the equation (5).

Next, in step S24, the specifying unit 12 determines whether or not all of the transformer IDs accepted in step S10 described above are selected. In a case where there is an unselected transformer ID, the process returns to step S12, and in a case where all the transformer IDs are selected, the process proceeds to step S30.

Figure 14:
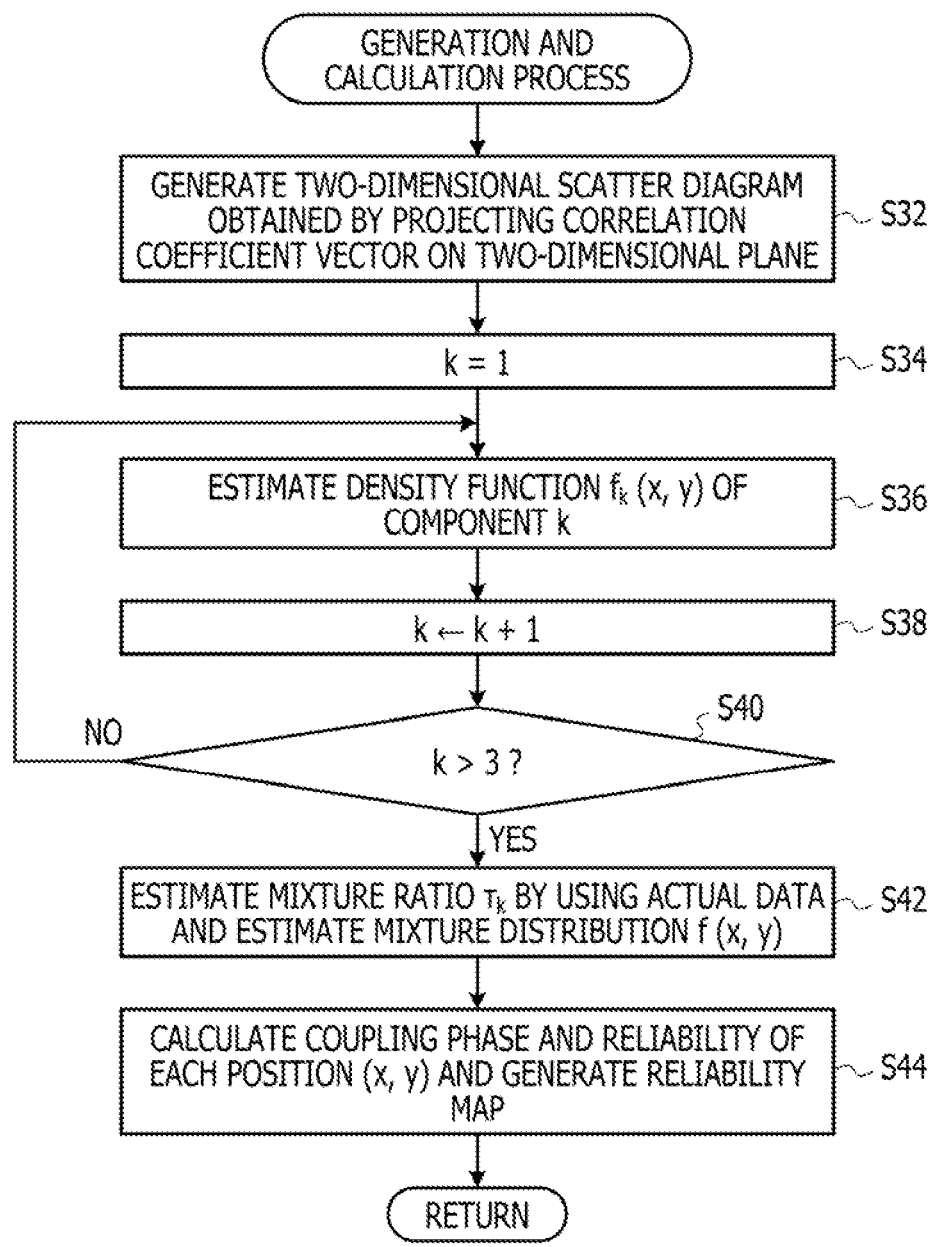
FIG. 14 is a flowchart illustrating an example of a generation and calculation process.

In step S30, a generation and calculation process is executed. The generation and calculation process will be described with reference to FIG. 14.

In step S32, the generation unit 14 generates a distribution of correlation coefficient vectors having the 3 correlation coefficients $\rho_{xs}^y$ {x∈a, b, c} for the phase current and each of the line currents calculated for each transformer as elements, as a three-dimensional scatter diagram having axes corresponding to the respective correlation coefficients. The generation unit 14 projects the correlation coefficient vector in the three-dimensional scatter diagram onto the plane n of the coordinate system (x, y) by the linear transformation indicated in the equation (7) to generate a two-dimensional scatter diagram.

Next, in step S34, the calculation unit 16 sets 1 to the variable k indicating the component number of the distribution in the two-dimensional scatter diagram. Next, in step S36, the calculation unit 16 estimates the density function $f_k$ (x, y) of the component k of the mixture distribution as indicated in, for example, the equation (8) or (9).

Next, in step S38, the calculation unit 16 increments k by 1. Next, in step S40, the calculation unit 16 determines whether or not k exceeds 3 that is the number of components. In a case of k≤3, the process returns to step S36. In a case of k>3, the process proceeds to step S42.

In step S42, the calculation unit 16 estimates the mixture ratio $\tau_k$ (k=1, 2, 3), which is a parameter of a mixture distribution f (x, y), by the EM algorithm or the like, based on the density function $f_k$ (x, y) (k=1, 2, 3) of each component and actual data of the line current and the phase current. Thus, the calculation unit 16 estimates the mixture distribution f (x, y) as a distribution of sample points corresponding to the correlation coefficient vectors in the two-dimensional scatter diagram.

Next, in step S44, the calculation unit 16 calculates a component k (k*) with which $\tau_k f_k$ (x, y) is maximized, for each position (x, y) in the two-dimensional scatter diagram by, for example, the equation (10), by using the estimated $f_k$ (x, y) and $\tau_k$ (k=1, 2, 3). A phase corresponding to the component k * is the coupling phase of the transformer at which the sample point is located at the point (x, y). The calculation unit 16 calculates the reliability C (x, y, k*) of the determination result of the coupling phase for each position (x, y) in the two-dimensional scatter diagram by, for example, the equation (11). The calculation unit 16 generates the reliability map 30 in which the calculated k* and C (x, y, k*) are associated with each position (x, y).

For example, it is assumed that at a position (x, y) indicated by a star in the reliability map 30 illustrated in FIG. 11, $\tau_1 f_1$ (x, y) is 0.80, $\tau_2 f_2$ (x, y) is 0.15, and $\tau_3 f_3$ (x, y) is 0.05. In this case, the calculation unit 16 associates k*=1 and reliability of 80% with the position (x, y). The generation and calculation process ends, and the map generation process itself also ends.

Figure 15:
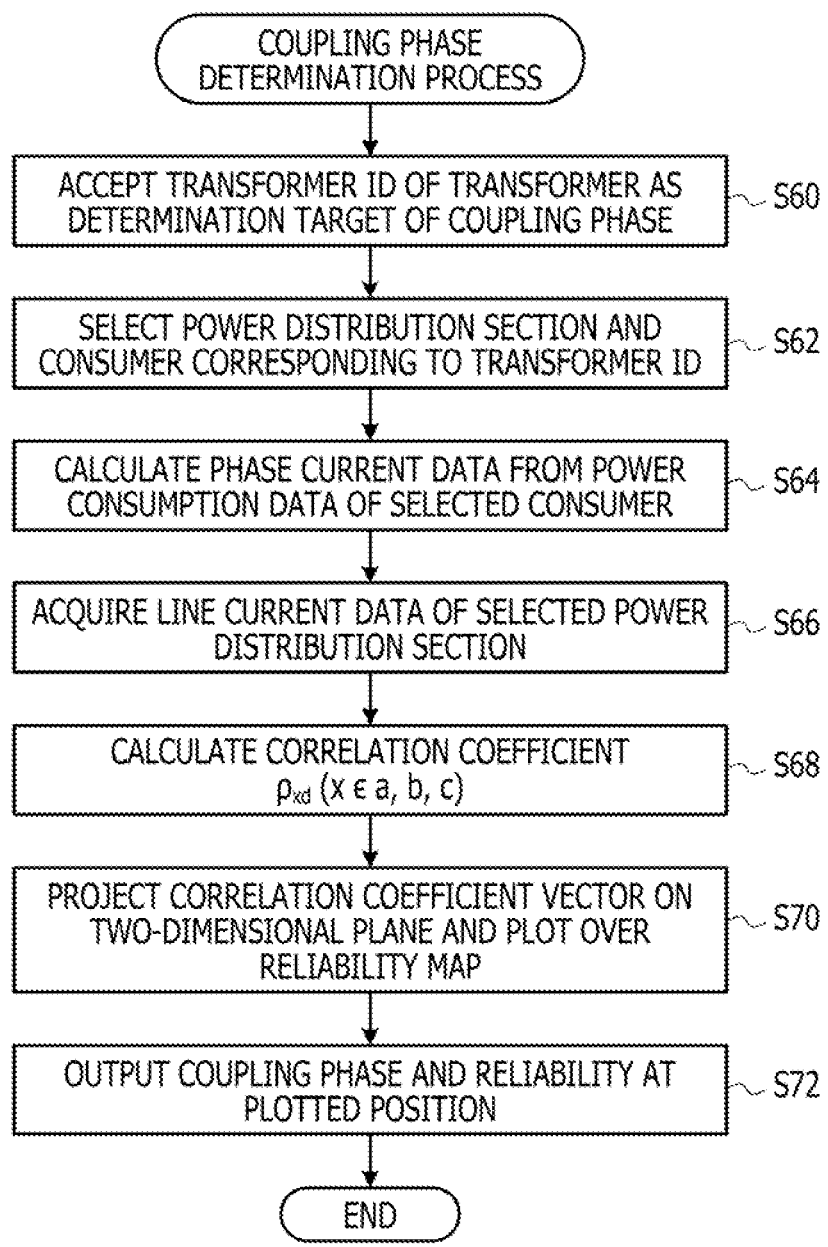
FIG. 15 is a flowchart illustrating an example of a coupling phase determination process.

Next, the coupling phase determination process illustrated in FIG. 15 will be described.

In step S60, the specifying unit 12 accepts an input transformer ID. Next, in step S62, the specifying unit 12 selects, from the power distribution information DB 22, a power distribution section ID and a consumer ID associated with a transformer ID that coincides with the transformer ID accepted in step S60 described above.

Next, in step S64, the specifying unit 12 acquires time-series data $P'_d$ (t) of power consumption of the actual consumer d associated with the consumer ID selected in step S62 from the actual power data DB 28. For example, the specifying unit 12 calculates time-series data $I'_d$ (t) of a phase current caused by the time-series data $P'_d$ (t) of the power consumption of the actual consumer d by the equation (1) in which "s" is replaced with "d" and "y" is deleted.

Next, in step S66, the specifying unit 12 acquires, from the line current data DB 26, the time-series data $I'_x$ (t) of 3 types of line currents in a power distribution section indicated by the power distribution section ID selected in step S62.

Next, in step S68, the specifying unit 12 uses, for example, the equation (4), in which "s" is replaced with "d" and "y" is deleted, to calculate the time-series data $I_x$ (t) of the line current and the time-series data $I_d$ (t) of the phase current in which each of $I'_x$ (t) and $I'_d$ (t) is represented by a variation from a time average. The specifying unit 12 calculates the correlation coefficient $\rho_{xd}$ {x∈a, b, c} between the time-series data $I_x$ (t) of the line current and the time-series data $I_d$ (t) of the phase current, which are indicated in the equation (5) in which "s" is replaced with "d" and "y" is deleted, for example. In the equation (5), a value of the time-series data $P'_d$ (t) of the power consumption of the actual consumer d may be used instead of a value of the time-series data $I_d$ (t) of the phase current. Since the two values have only a constant multiple difference, the values are the same as values of a correlation index such as the correlation coefficient.

Next, in step S70, the determination unit 18 converts a correlation coefficient vector having the 3 correlation coefficients $\rho_{xd}$ {x∈a, b, c} calculated in step S68 described above as elements into two-dimensional coordinate values by the equation (7) in which "s" is replaced with "d" and "y" is deleted. The determination unit 18 plots the converted two-dimensional coordinate values in the reliability map 30, and determines a coupling phase of a transformer as a determination target, based on the component k* associated with the plotted position (x, y). The determination unit 18 acquires reliability of the determination result, based on C (x, y, k*) associated with the plotted position (x, y) in the reliability map 30. For example, in a case where the plotted position is a position indicated by the star in the reliability map 30 illustrated in FIG. 11, the determination unit 18 determines that the coupling phase of the transformer as a determination target is a phase (the ab phase) corresponding to a component 1 and reliability of the determination result is 80%. The determination unit 18 processes and outputs the determination result and the reliability of the coupling phase in a form that may be displayed on a display apparatus, printed by a printing apparatus, or the like, and the coupling phase determination process ends.

As described above, the transformer coupling phase determination apparatus according to the present embodiment generates simulation data related to an operation of a power distribution facility including a plurality of power distribution lines and one or more transformers coupled to a phase corresponding to a combination of two of the plurality of power distribution lines. The simulation data is generated for each pattern of the phase to which the transformer is coupled. The transformer coupling phase determination apparatus specifies a correlation relationship between a phase current that is a current flowing in the transformer and a line current that is a current flowing in each of the plurality of power distribution lines. The transformer coupling phase determination apparatus generates a scatter diagram indicating the degree of correlation between the phase current and each of the line currents, based on the simulation data and the correlation relationship for each pattern, and calculates a probability density at each position in the scatter diagram for each pattern. The transformer coupling phase determination apparatus determines a coupling phase of the transformer in actual data, based on positions in a case where the actual data of the phase current and the line current in the operation of the power distribution facility are plotted in the scatter diagram and a calculation result of the probability density. Thus, in a case where acquirable power data of a consumer is small or the coupling phase of the transformer corresponding to each point in the scatter diagram is unknown, it is possible to solve the problem that estimation of a mixture distribution indicating the scatter diagram becomes unstable and determination accuracy deteriorates, and to determine the coupling phase of the transformer with high accuracy.

In the above embodiment, an aspect is described in which the transformer coupling phase determination program is stored (installed) in advance in the storage unit, and the embodiment is not limited thereto. The program according to the disclosed technology is able to be provided in a form stored in a storage medium such as a compact disc read-only memory (CD-ROM), a Digital Versatile Disc (DVD)-ROM, a Universal Serial Bus (USB) memory, or the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing a transformer coupling phase determination program for causing a computer to execute a process, the process comprising:

specifying, based on simulation data, related to an operation of a power distribution network including a plurality of high-voltage power distribution lines, a plurality of transformers coupled to a plurality of phases which corresponds to a combination of two of the plurality of high-voltage power distribution lines, a plurality of low-voltage power distribution lines coupled to secondary sides of the plurality of transformers and a plurality of actual consumers to which a power is transmitted through the plurality of low-voltage power distribution lines, which is provided for each of the plurality of phases and includes data of power consumed by a plurality of virtual consumers, a correlation relationship between a phase current that is a current flowing through each of the transformers and a line current that is a current flowing through each of the plurality of high-voltage power distribution lines;

generating a scatter diagram indicating a degree of correlation between the phase current and the line current, based on the simulation data for each phase and the correlation relationship;

calculating a probability density at each position in the scatter diagram, for each phase;

accepting an identification information of a target transformer a coupling phase of which is determined;

specifying a power distribution section and an actual consumer corresponding to the identification information;

acquiring actual data of phase current and the line current based on the power distribution section and the actual consumer; and selecting, based on a position in a case where the actual data of the phase current and the line current is plotted in the scatter diagram and a calculation result of the probability density, a coupling phase of the target transformer in the actual data from among the plurality of phases.

2. The non-transitory computer-readable recording medium according to claim 1, wherein the simulation data includes the phase current of the phase to which the transformer is coupled the phase current being caused by power consumed by a virtual consumer coupled to the transformer, and the line current obtained by reflecting a variation caused by the phase current in a line current which is the actual data.

3. The non-transitory computer-readable recording medium according to claim 2, wherein the specifying of the correlation relationship includes generating the simulation data by generating data of the power consumed by the virtual consumer by using standard data of power prepared in advance, calculating the phase current based on the generated data of the power, and calculating the line current based on the calculated phase current and a circuit configuration of a power distribution facility in the power distribution network.

4. The non-transitory computer-readable recording medium according to claim 3, wherein the generating of the simulation data includes adjusting at least one of a distribution of the number of pieces of the simulation data for each pattern, a coefficient for generating the data of the power from the standard data, and a distribution of a load on the two of the high-voltage power distribution lines corresponding to the phase to which the transformer is coupled.

5. The non-transitory computer-readable recording medium according to claim 4, wherein the adjusting includes adjusting based on a result of statistical analysis of previously acquirable information on the power distribution facility as a determination target.

6. The non-transitory computer-readable recording medium according to claim 1, wherein the generating of the scatter diagram includes projecting a distribution of a vector having, as an element, each value indicating the degree of correlation between the phase current and each of the line currents onto a plane having, as a normal vector, a vector symmetrical to an axis corresponding to each value indicating the degree of correlation.

7. The non-transitory computer-readable recording medium according to claim 6, wherein the calculating of the probability density includes estimating a probability density distribution for a distribution of the vector projected onto the plane for each pattern.

8. The non-transitory computer-readable recording medium according to claim 7, wherein the calculating of the probability density includes estimating a mixture ratio of the probability density distribution estimated for each pattern by using the actual data of the phase current and the line current.

9. The non-transitory computer-readable recording medium according to claim 1, wherein the selecting of the coupling phase of the target transformer includes determining, as the coupling phase of the target transformer, a phase corresponding to a pattern having a highest calculated probability density at the position of the scatter diagram at which the actual data is plotted, and outputting the highest probability density as reliability of a determination result.

10. An information processing apparatus comprising:
a memory; and
a computer coupled to the memory and configured to:
specify, based on simulation data, related to an operation of a power distribution network including a plurality of high-voltage power distribution lines, a plurality of transformers coupled to a plurality of phases which corresponds to a combination of two of the plurality of high-voltage power distribution lines, a plurality of low-voltage power distribution lines coupled to secondary sides of the plurality of transformers and a plurality of actual consumers to which a power is transmitted through the plurality of low-voltage power distribution lines, which is provided for each of the plurality of phases and includes data of power consumed by a plurality of virtual consumers, a correlation relationship between a phase current that is a current flowing through each of the transformer and a line current that is a current flowing through each of the plurality of high-voltage power distribution lines;
generate a scatter diagram indicating a degree of correlation between the phase current and the line current, based on the simulation data for each phase and the correlation relationship;
calculate a probability density at each position in the scatter diagram, for each phase;
accept an identification information of a target transformer a coupling phase of which is determined;
specify a power distribution section and an actual consumer corresponding to the identification information;
acquire actual data of phase current and the line current based on the power distribution section and the actual consumer; and
select, based on a position in a case where the actual data of the phase current and the line current is plotted in the scatter diagram and a calculation result of the probability density, a coupling phase of the target transformer in the actual data from among the plurality of phases.

11. The information processing apparatus according to claim 10, wherein the simulation data includes the phase current of the phase to which the transformer is coupled, the phase current being caused by power consumed by a virtual consumer coupled to the transformer, and the line current obtained by reflecting a variation caused by the phase current in a line current which is the actual data.

12. The information processing apparatus according to claim 11, wherein the processor generates the simulation data by generating data of the power consumed by the virtual consumer by using standard data of power prepared in advance, calculates the phase current based on the generated data of the power, and calculates the line current based on the calculated phase current and a circuit configuration of a power distribution facility in the power distribution network.

13. The information processing apparatus according to claim 12, wherein the processor adjusts at least one of a distribution of the number of pieces of the simulation data for each pattern, a coefficient for generating the data of the power from the standard data, and a distribution of a load on the two of the high-voltage power distribution lines corresponding to the phase to which the transformer is coupled.

14. The information processing apparatus according to claim 13, wherein the processor includes adjusts based on a result of statistical analysis of previously acquirable information on the power distribution facility as a determination target.

15. The information processing apparatus according to claim 10, wherein the processor projects a distribution of a vector having, as an element, each value indicating the degree of correlation between the phase current and each of the line currents onto a plane having, as a normal vector, a vector symmetrical to an axis corresponding to each value indicating the degree of correlation.

16. The information processing apparatus according to claim 15, wherein the processor estimates a probability density distribution for a distribution of the vector projected onto the plane for each pattern.

17. The information processing apparatus according to claim 16, wherein the processor estimates a mixture ratio of the probability density distribution estimated for each pattern by using the actual data of the phase current and the line current.

18. The information processing apparatus according to claim 10, wherein the processor selects, as the coupling phase of the target transformer, a phase corresponding to a pattern having a highest calculated probability density at the position of the scatter diagram at which the actual data is plotted, and outputs the highest probability density as reliability of a determination result.

19. A transformer coupling phase determination method comprising:
specifying, by a computer, based on simulation data, related to an operation of a power distribution network including a plurality of high-voltage power distribution lines, a plurality of transformers coupled to a plurality of phases which corresponds to a combination of two of the high-voltage plurality of power distribution lines, a plurality of low-voltage power distribution lines coupled to secondary sides of the plurality of transformers and a plurality of actual consumers to which a power is transmitted through the plurality of low-voltage power distribution lines, which is provided for each of the plurality of phases and includes data of power consumed by a plurality of virtual consumers, a correlation relationship between a phase current that is a current flowing through each of the transformer and a line current that is a current flowing through each of the plurality of high-voltage power distribution lines;
generating a scatter diagram indicating a degree of correlation between the phase current and the line current, based on the simulation data for each phase and the correlation relationship;
calculating a probability density at each position in the scatter diagram, for each phase;
accepting an identification information of a target transformer a coupling phase of which is determined;

specifying a power distribution section and an actual consumer corresponding to the identification information;

acquiring actual data of phase current and the line current based on the power distribution section and the actual consumer; and selecting, based on a position in a case where the actual data of the phase current and the line current is plotted in the scatter diagram and a calculation result of the probability density, a coupling phase of the target transformer in the actual data from among the plurality of phases.

* * * * *